United States Patent
Holaday et al.

(10) Patent No.: US 7,272,528 B2
(45) Date of Patent: Sep. 18, 2007

(54) RELOADABLE WORD RECOGNIZER FOR LOGIC ANALYZER

(75) Inventors: David A. Holaday, Cornelius, OR (US); Gary K. Richmond, Beaverton, OR (US); Donald C. Kirkpatrick, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 967 days.

(21) Appl. No.: 10/253,621

(22) Filed: Sep. 23, 2002

(65) Prior Publication Data

US 2003/0065500 A1 Apr. 3, 2003

Related U.S. Application Data

(60) Provisional application No. 60/326,503, filed on Oct. 1, 2001.

(51) Int. Cl.
*G06F 11/30* (2006.01)
*G06F 11/00* (2006.01)

(52) U.S. Cl. .............. 702/118; 73/432.1; 73/865.9; 324/73.1; 324/500; 324/527; 324/555; 702/108; 702/117; 702/119; 702/123; 714/25; 714/37; 714/39

(58) Field of Classification Search ............. 73/432.1, 73/865.9, 866.1; 324/73.1, 500, 512, 527, 324/555; 702/57, 58, 66, 108, 117, 118, 702/119, 123; 714/25, 37, 39, 41, 42, 43, 714/44
See application file for complete search history.

(56) References Cited

U.S. PATENT DOCUMENTS

| | | | | | |
|---|---|---|---|---|---|
| 2,950,437 | A | * | 8/1960 | Stahl | 324/73.1 |
| 3,082,374 | A | * | 3/1963 | Buuck | 324/73.1 |
| 4,791,357 | A | * | 12/1988 | Hyduke | 324/73.1 |
| 5,864,658 | A | * | 1/1999 | Theobald | 714/25 |
| 6,028,439 | A | * | 2/2000 | Arkin et al. | 324/765 |
| 6,101,622 | A | * | 8/2000 | Lesmeister | 714/724 |
| 6,122,757 | A | * | 9/2000 | Kelley | 714/39 |
| 6,370,661 | B1 | * | 4/2002 | Miner | 714/718 |
| 6,894,308 | B2 | * | 5/2005 | Whetsel et al. | 257/48 |
| 2003/0065500 | A1 | * | 4/2003 | Holaday et al. | 704/1 |
| 2007/0061637 | A1 | * | 3/2007 | Ward et al. | 714/718 |
| 2007/0100586 | A1 | * | 5/2007 | Cheng et al. | 702/185 |

* cited by examiner

*Primary Examiner*—Edward R Cosimano
(74) *Attorney, Agent, or Firm*—Thomas F. Lenihan; Francis I. Gray

(57) ABSTRACT

A test and measurement instrument such as a Logic Analyzer, or the like, has at least one Reloadable Word Recognizer whose reference value can be loaded by a trigger machine with a current acquired data sample while data is being acquired. In a second embodiment useful for performing memory testing, the reloadable word recognizer is used in cooperation with two conventional word recognizers. In a third embodiment, a delay unit is employed to provide delayed input data words as reference words. In a fourth embodiment, an offset register and adder are used to modify the input data words before storing them. A fifth embodiment provides for substantially immediate use of base addresses of relocatable subroutines and stack-based variables recovered from a data stream acquired from a system under test.

11 Claims, 6 Drawing Sheets

RELOADABLE WORD RECOGNIZER FOR LOGIC ANALYZER

CLAIM FOR PRIORITY

The Subject application claims priority from U.S. Provisional Application Ser. No. 60/326,503 now expired and entitled RELOADABLE WORD RECOGNIZER FOR LOGIC ANALYZER (Holaday, et al.) filed 1 Oct. 2001.

FIELD OF THE INVENTION

The subject invention generally concerns the field of word recognizers for use in test and measurement instruments, such as logic analyzers, and the like, and specifically concerns word recognizer that may be reloaded during an acquisition of data.

BACKGROUND OF THE INVENTION

A logic analyzer is a test and measurement instrument having multiple input channels for acquiring digital data words for processing and display. Logic analyzers contain Word Recognizers, which are programmed with a reference value for comparison with incoming acquired data. Because the user wishes to trigger on a condition in which the reference value matches the value of the incoming data, the "reference value" of the Word Recognizer is preprogrammed before data acquisition is begun, and is not changed while data is being acquired. It is noted that Word Recognizers also have the ability to mask, or disable selected channels, which allow these channels to be ignored while comparing the acquired data and reference data.

However, currently available Word Recognizers cannot provide a solution to the following problem. In a Random Access Memory (RAM) diagnostic routine, a data pattern is written to all locations of the RAM, and then the data is read from each of the locations. The routine then reports the results (i.e. whether the RAM passed the check) and the process is repeated with the next pattern. If an error is detected, it is unknown whether the problem occurred when the data was written to the RAM, or when the data was read from the RAM. Because the RAM has been overwritten, the RAM cannot be examined to determine if it contains the correct value. One would like to write a trigger program to verify that data written to the RAM is the same as what is read back from the RAM and to trigger the Logic Analyzer when the data is not the same. With current logic analyzers this is not possible because the data pattern is changing, which means it is not possible to preprogram the "Reference Value" of the Word Recognizer with a meaningful value.

SUMMARY OF THE INVENTION

The subject invention concerns a test and measurement instrument such as a logic analyzer, or the like, having at least one Reloadable Word Recognizer whose reference value can be loaded by a trigger machine with a current acquired data sample while data is being acquired. In a second embodiment useful for performing memory testing, the reloadable word recognizer is used in cooperation with two conventional word recognizers. In a third embodiment, a delay unit is employed to provide delayed input data words as reference words. In a fourth embodiment, an offset register and adder are used to modify the data words before storing them. A fifth embodiment provides for substantially immediate use of base addresses of relocatable subroutines and stack-based variables recovered from a data stream acquired from a system under test.

DETAILED DESCRIPTION OF THE EMBODIMENTS

Figure 1:
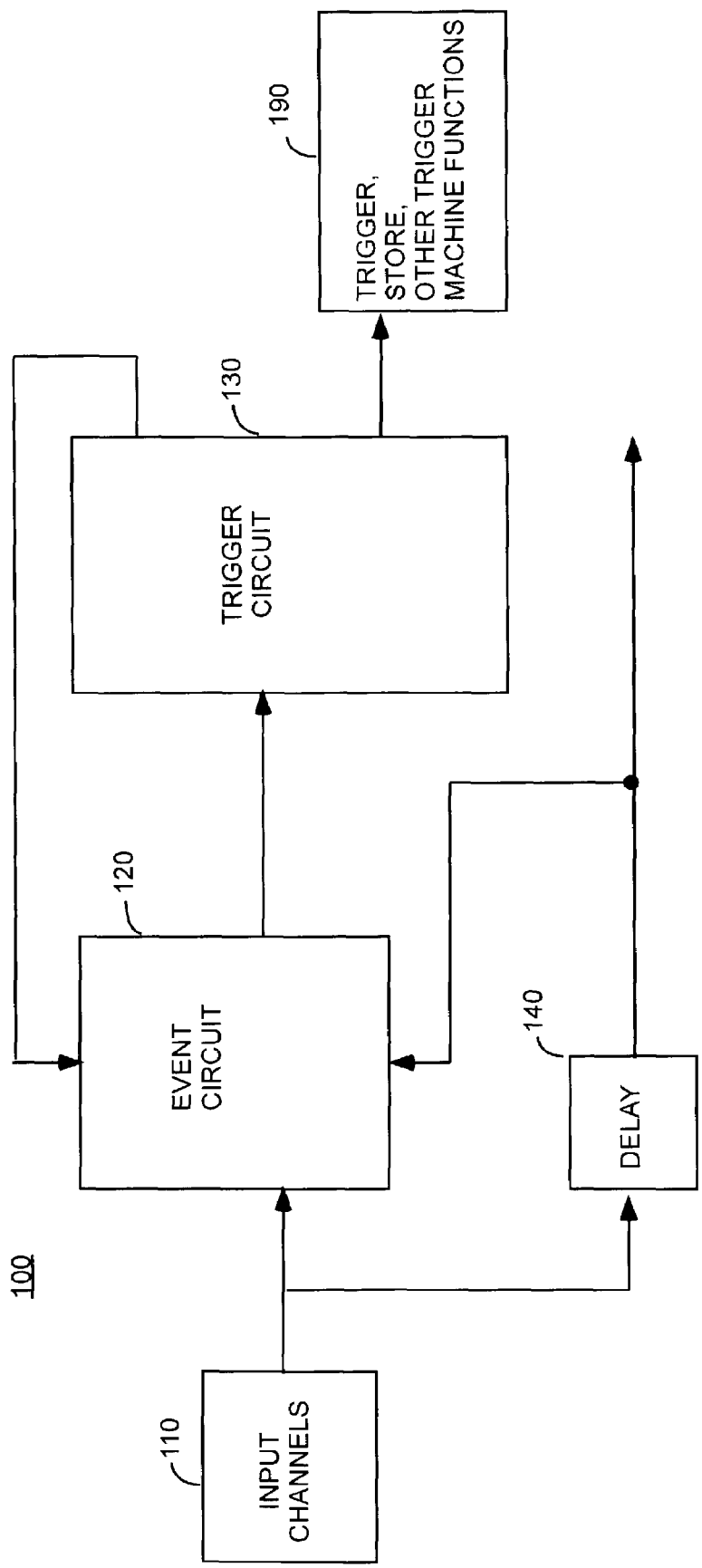
FIG. 1 shows a simplified block diagram of a trigger portion of a logic analyzer according to the subject invention.

Referring to FIG. 1, those portions of a logic analyzer that are pertinent to the subject invention are shown and generally designated 100. An Input Channels block 110 includes acquisition circuitry for acquiring digital data from a circuit under test via a plurality of input data channels. The data acquired from the user's system is presented to an Event Circuit 120. Event Circuit 120 contains Word Recognizers, Range Recognizers, Transition Detectors, etc. For purposes of explanation of the subject invention, only the Word Recognizers will be discussed below.

An output signal of Event Circuit 120 is applied to a Trigger Machine (or Trigger Circuit) 130. Trigger Circuit 130 determines when to trigger, store, etc, and when to load a Reloadable Word Recognizer (to be described below with reference to FIG. 2) with a current data sample. When appropriate, Trigger Circuit 130 generates a Reload Signal for application to Event Circuit 120. A Delay block 140 delays the incoming data to match the delay through Event Circuit 120 and Trigger Circuit 130. This is necessary so that data is time-aligned with the output signal of Trigger Circuit 130 to ensure proper data storage or proper reloading of the Word Recognizer. Trigger machine circuitry for performing further functions is represented by block 190.

Figure 2:
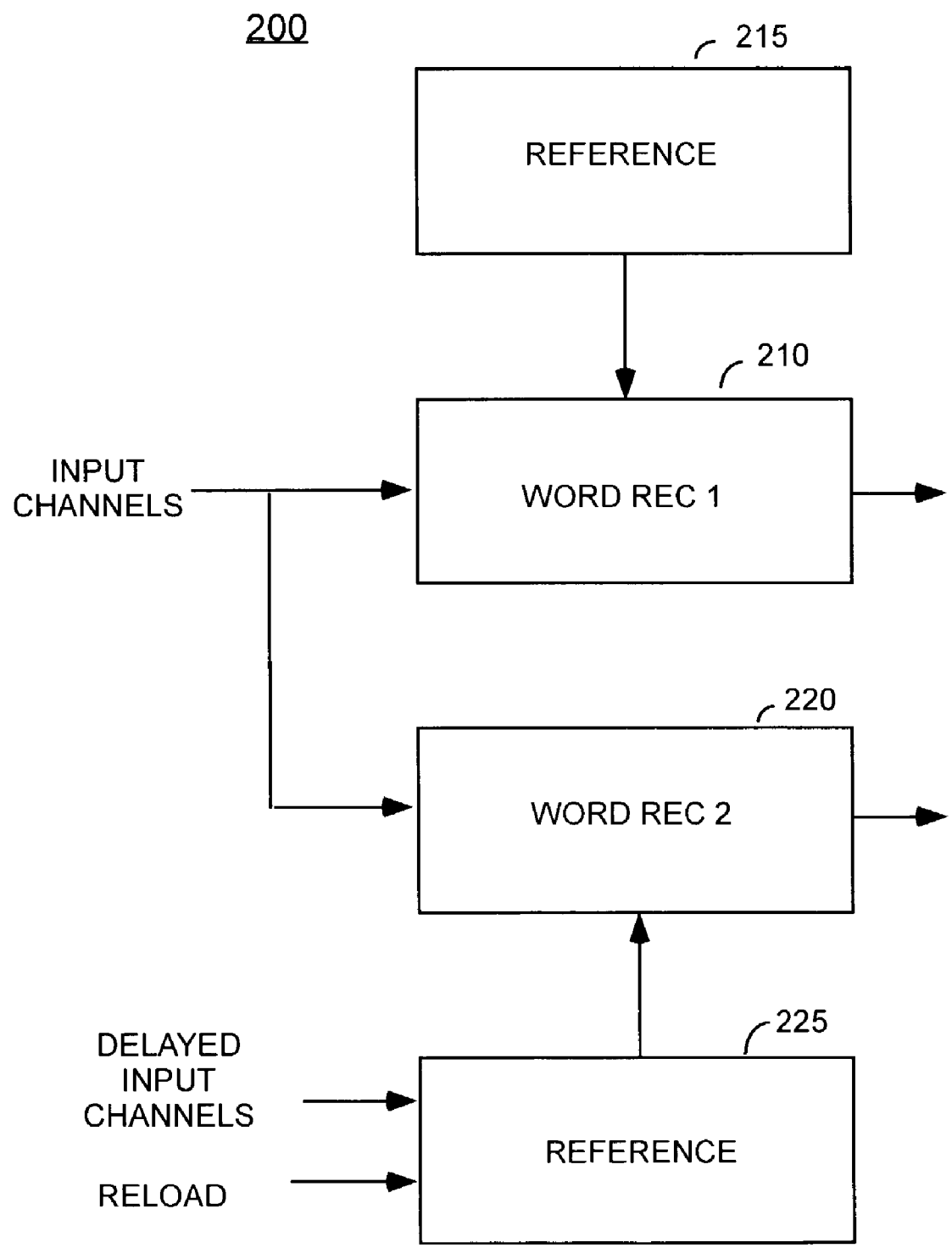
FIG. 2 shows a simplified block diagram of an interior detail of the Event Circuit of FIG. 1.

FIG. 2 shows a block diagram of at least some of the elements, generally designated 200, which reside within Event Circuit 120 of FIG. 1. The elements 200 include a first Word Recognizer comparison unit (Word REC 1) 210, a second Word Recognizer comparison unit (Word REC 2) 220, a preprogrammable reference block 215, and a repogammable reference block 225. Word REC 1 210 is a conventional Word Recognizer comparison unit as known from the prior art. As such, incoming data received via Input Channels block 110 are compared against a value preprogrammed and stored in reference block 215. A predetermined "Reference Value" is loaded into reference block 215 before a data acquisition is begun. Thereafter, this preprogrammed reference value remains unchanged during the entire data acquisition. The output of Word Rec 1 210 is the result of a comparison between its preprogrammed reference value and the incoming data.

In contrast, Word Rec 2 220 is a reloadable Word Recognizer. Like Word Rec 1 210, Word REC 2 220 compares incoming data against a value held in its respective Reference Block 225. However, the respective "Reference Value"

of each of reference blocks 215 and 225 is different from the other, except for cases where the data values coincidentally happen to be the same.

Operation of the subject invention is described with reference to FIGS. 1 and 2. In operation, incoming data is delayed in delay unit 140 while Trigger Circuit 130 evaluates the result of the comparison of reference data and current sample data within Event circuit 120. If the results match the criteria that the Trigger Circuit is programmed for, then a reload strobe signal is generated and applied to Event circuit 120. This reload strobe will cause the delayed incoming data to be loaded into Reference block 225. The Reloadable Word Recognizer comparison unit, Word Rec 2 220, can be reloaded as often as desired during an acquisition.

Figure 3:
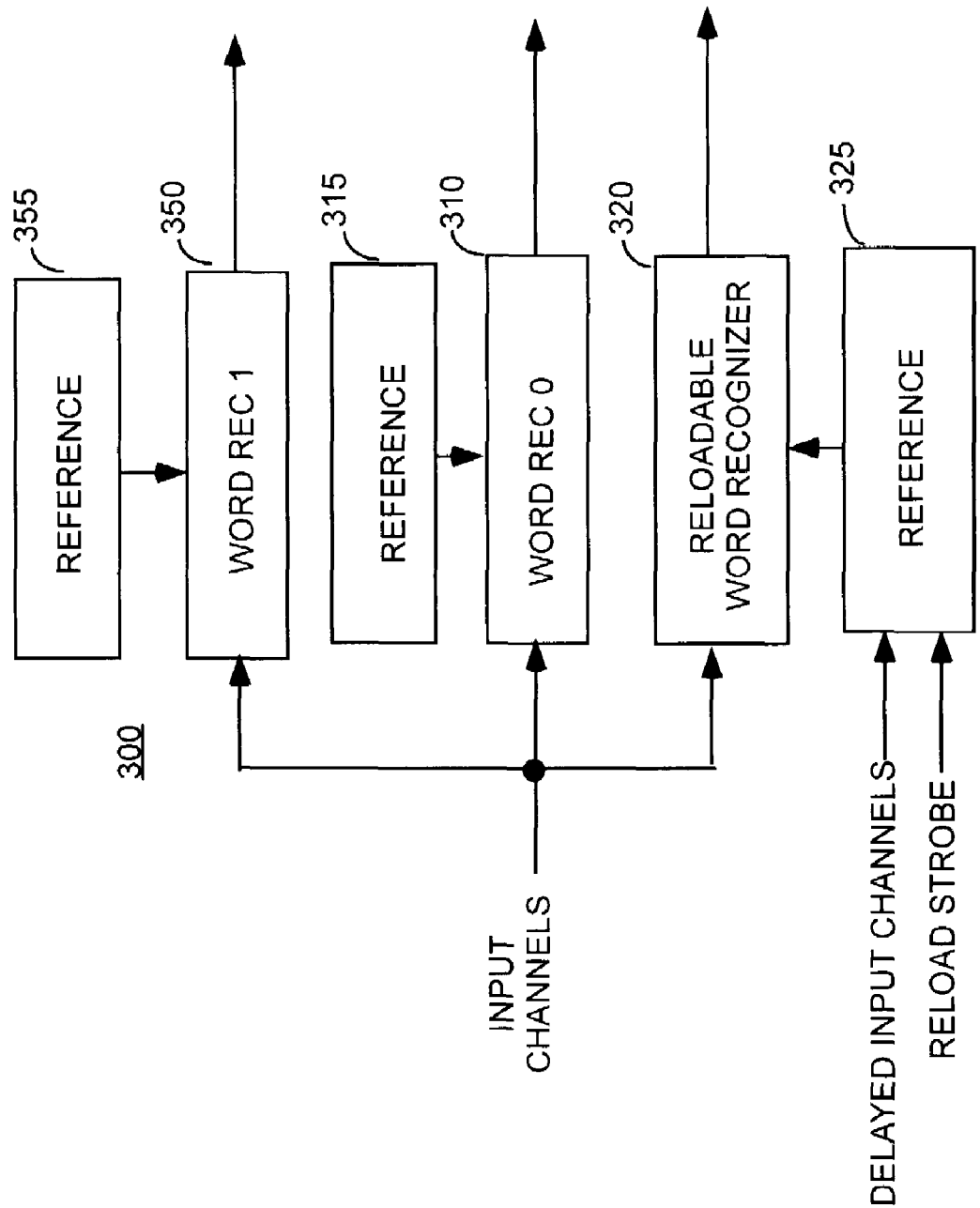
FIG. 3 shows a simplified block diagram of a second embodiment of the invention.

With respect to the problem set forth above with respect to the RAM diagnostics routine, such problem is solved by use of another embodiment 300 of the subject invention, employing a Reloadable Word Recognizer 320 with associated Reference Block 325 and two conventional Word Recognizers 310 and 350, as shown in FIG. 3. Similarly numbered elements of FIGS. 2 and 3 serve the same function and need not be described again. A conventional Word Recognizer (WR 0) 310 with associated Reference Block 315 is preprogrammed to generate a "match" signal when a "write data to memory" operation occurs at a specific RAM address. Another conventional Word Recognizer (WR 1) 350 with associated Reference Block 355 is preprogrammed to generate a "match" signal when a "read data from memory" operation occurs from this same address. Only the data channels (in contrast to address channels) are enabled on Reloadable Word Recognizer (RWR) 320. A "trigger program" (i.e., a program for triggering the logic analyzer) running on Trigger machine 130 generates a Reload Strobe when the result of a comparison within word recognizer WR 0 310 is true (i.e., matches). The trigger program wilt- produce produces a trigger signal when the result of a comparison within word recognizer WR 1 350 is true AND when the result of a comparison within word recognizer RWR 320 is false.

In operation, when a write to specified RAM address occurs, the output of word recognizer WR 0 310 becomes true and causes Reloadable Word Recognizer 320 to be loaded with the data value that was written to this specific RAM address. Later, when a read from memory operation occurs from this same address the output of word recognizer WR 1 350 becomes true. If the output of Reloadable Word Recognizer RWR 320 is true, then nothing happens until the next read or write operation to this address. When the output of Reloadable Word Recognizer RWR 320 goes false, trigger machine 130 triggers. Note that as long as all outputs of the word recognizers are true, then Reloadable Word Recognizer RWR 320 can be reloaded with a new value over and over again.

Figure 4:
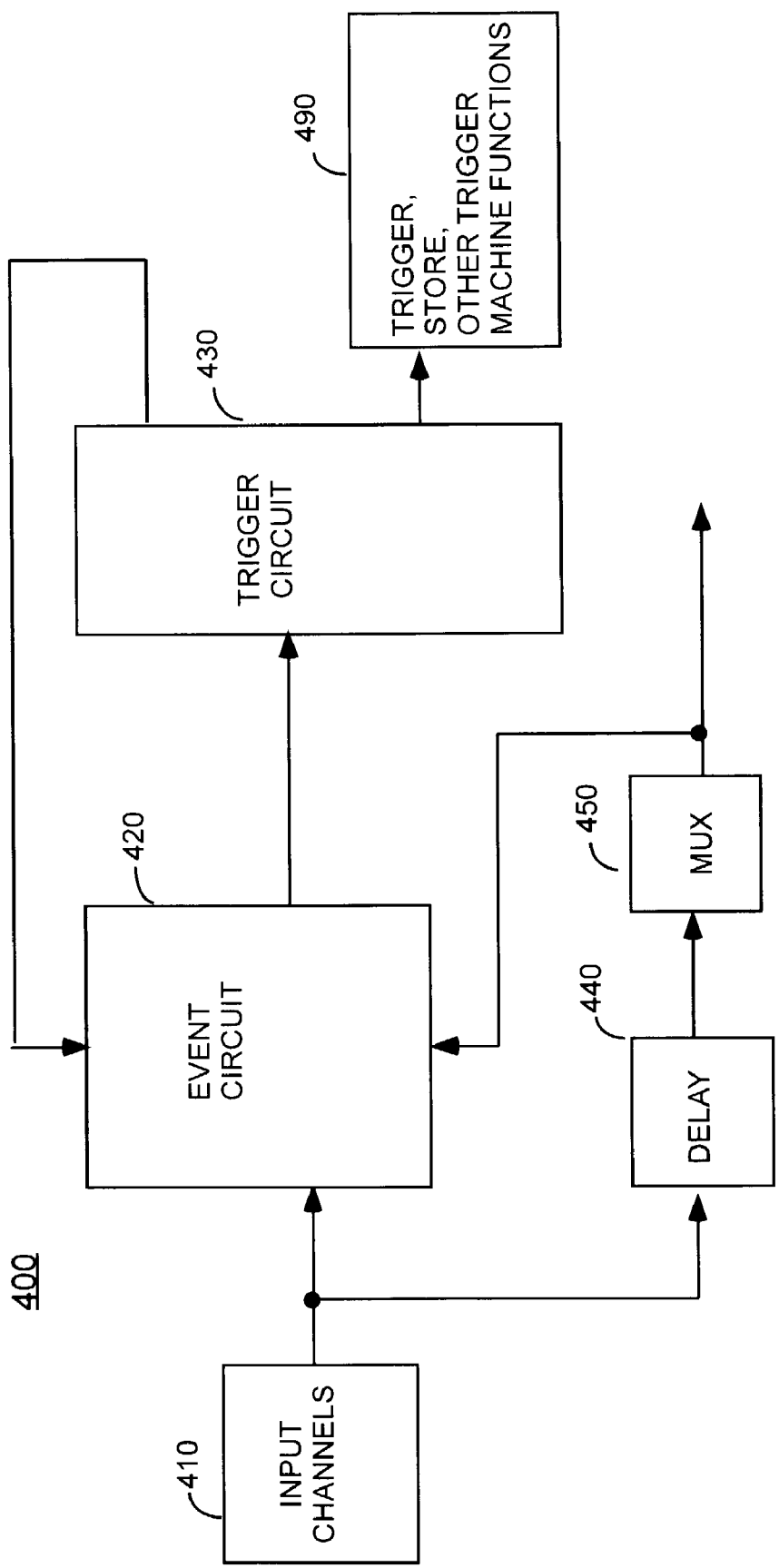
FIG. 4 shows a simplified block diagram of a third embodiment of the invention.

There are two enhancements to the above-described invention that are deemed to lie within the bounds of the invention. FIG. 4 shows one enhancement 400 with all of the elements 410, 420, 430, 440, 490 that correspond respectively to elements 110, 120, 130, 140 190 of FIG. 1 and further includes a Multiplexer (MUX) 450 positioned between Delay Circuit 440 and Event Circuit 420. Channels could be "swizzled" before becoming a reference value. This allows addressing information present on the data bus to be mapped over to address channels for comparison purposes.

Figure 5:
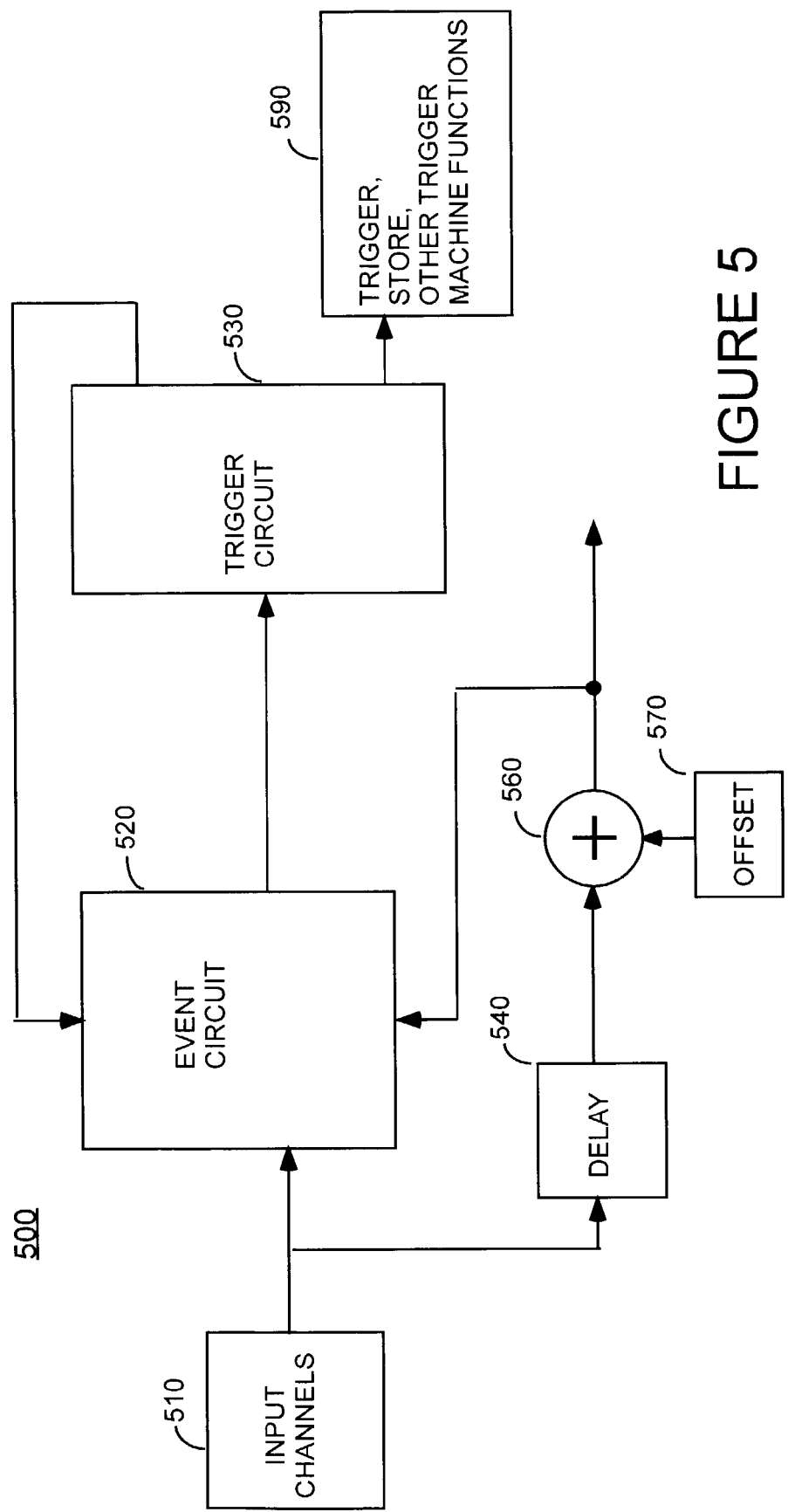
FIG. 5 shows a simplified block diagram of a fourth embodiment of the invention.

The second enhancement 500 is shown in FIG. 5 that includes all of the elements 510, 520, 530, 540, 590 that correspond respectively to elements 110, 120, 130, 140 190 of FIG. 1 and further includes an offset register 570 and adder unit 560, which reside between Delay Circuit 540 and Event Circuit 520. The value n (any integer number) in offset register 570 is loaded before data is acquired, and is added to the delayed data before being reloaded as the reference value. This enhancement is quite useful. For example, assume that the value stored in the offset register is equal to 5. In that case, one may track every 5th line in a subroutine. Moreover, if one changes the address of a subroutine, the delayed data value has the new base address information when the reload operation occurs.

Figure 6:
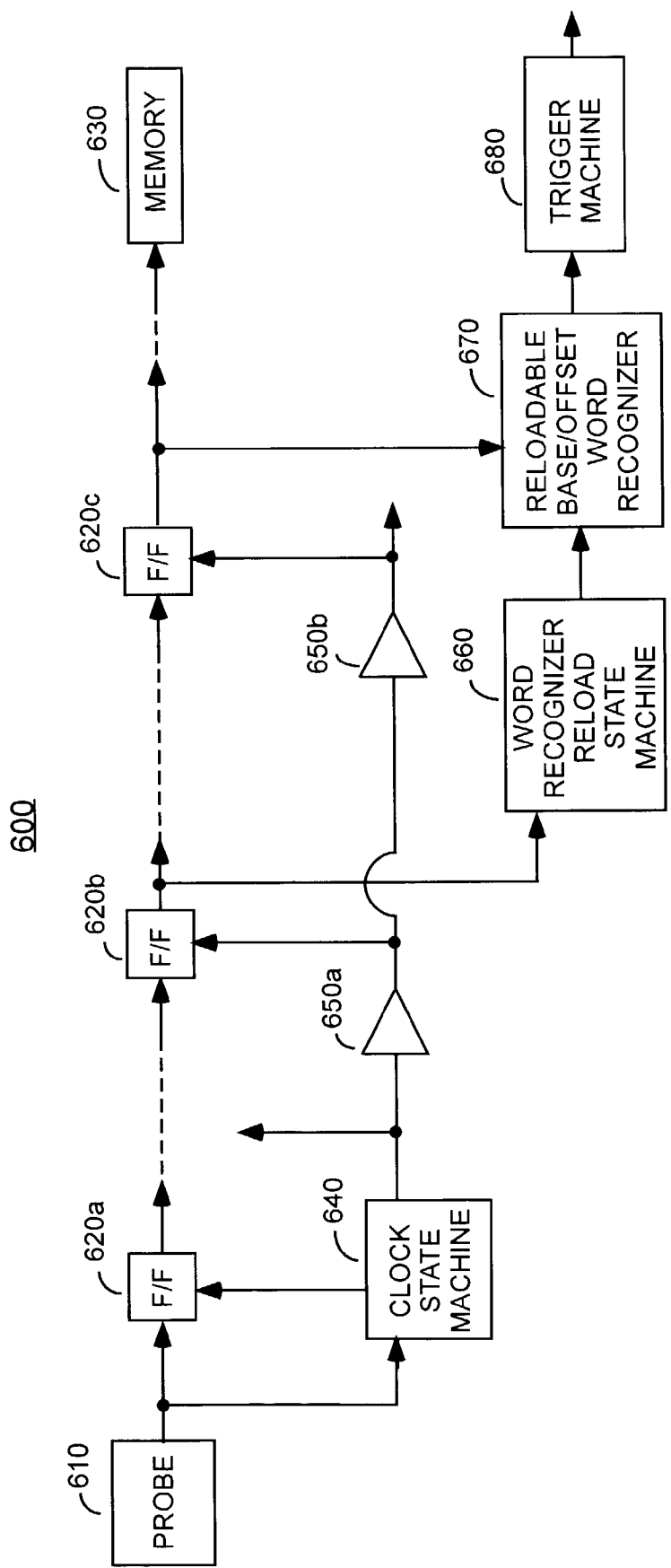
FIG. 6 shows a simplified block diagram of a fifth embodiment of the invention.

FIG. 6 shows a simplified block diagram of a front end of a logic analyzer 600 according to yet another embodiment of the invention. A Probe 610 acquires digital data words from a system under test, and applies them to a conventional data pipeline having a plurality of flip-flop (F/F) circuits, explicitly represented by flip-flops 620a, 620b, 620c and implicitly represented by a dotted line. The pipeline ultimately provides the acquired data to a memory 630. A Clock State Machine 640 provides clock signals to the pipeline flip-flops via a clock delay chain comprising a plurality of delay stages, represented by delay stages 650a, 650b.

A Word Recognizer Reload State Machine 660 monitors the pipeline bus for the occurrence of a predetermined data word. Upon detection of the predetermined data word at the output of flip-flop 620b, Word Recognizer Reload State Machine 660 acquires a reference word and loads it into a Reloadable Base/Offset Word Recognizer 670. In this way, Reloadable Base/Offset Word Recognizer 670 can use the new reference word substantially immediately (i.e., as early as the next clock cycle). Reloadable Base/Offset Word Recognizer 670 applies data word detection signals to Trigger Machine 680 in the conventional fashion. The combination of Word Recognizer Reload State Machine 660 and Reloadable Base/Offset Word Recognizer 670 produces a "real time" "hardware" relocation of all word recognizer values.

It is important to note that the arrangement of FIG. 6 is particularly useful when attempting to track relocatable code elements such as subroutines and stack-based variables. This has heretofore been a vexing problem because one knows only the relative addresses of the variables and code until the stack frame is built and the code is loaded at run time. In operation, Word Recognizer Reload State Machine 660 searches for code that allocates and relocates software routines (i.e., a reload address/data pattern). When found, a new base displacement is acquired from the pipeline and supplied to Reloadable Base/Offset Word Recognizer 670. Thus, the base address, just found by the Reload State Machine 660, and an offset, taken from the compiler, combine in the base-offset word recognizer 670 to form an absolute address immediately available for use in tracking the relocatable code of the system under test. Proper sizing of the number of stages in the data shift register pipeline 620 guarantees time-alignment of the base-offset word recognizer search and the data being searched which results in zero-latency between the reload and search.

Although a hardware environment was used to describe the subject invention, one skilled in the art will realize that the hardware maybe performed by software, or by a combination of hardware and software, and all such modifications are deemed to lie within the scope of the following claims.

What is claimed is:

1. A reloadable word recognizer for use in a test and measurement instrument, comprising:
a digital word comparison unit having an input for receiving a digital reference word representing a reference value, an input for receiving digital data words acquired from a circuit under test, and an output; and a register having an input for receiving a reload strobe, an input for receiving new digital reference words derived from said digital data words, and an output coupled to said digital reference word input of said digital word comparison unit for providing said digital reference word to said digital word comparison unit;

one of said new digital reference words being stored in said register as said digital reference word in response to said reload strobe.

2. The reloadable word recognizer of claim 1 wherein said test and measurement instrument comprises a logic analyzer.

3. The reloadable word recognizer of claim 2 further comprising a delay unit having an input for receiving said digital data words and an output for providing delayed digital data words as said new digital reference words.

4. The reloadable word recognizer of claim 3 wherein said delayed digital data words are applied to said new digital reference words input of said register, one of said delayed digital data words being stored in said register as said digital reference word in response to said reload strobe.

5. The reloadable word recognizer of claim 4 further comprising a multiplexer having an input for receiving addressing information in said delayed digital data words and an output coupled to said new digital reference words input of said register for providing address words for storage as said digital reference word in response to the reload strobe for comparing addresses.

6. The reloadable word recognizer of claim 4 further comprising:

an offset register having an input for receiving and storing offset information words, and an output for providing offset data words having a value of n where n is any integer number; and an adder having a first input for receiving said delayed digital data words representing address data, and a second input for receiving said offset data words;

said adder adding said data words at said first and second inputs and producing at an output offset address data words as said new digital reference words for addressing every nth address.

7. A logic analyzer comprising:

a first word recognizer being programmable with a first reference value only before a particular data acquisition is begun;

a second word recognizer being programmable with a second reference value only before said particular data acquisition is begun; and a reloadable word recognizer including a digital word comparison unit having an input for receiving a digital reference word representing a variable reference value, an input for receiving digital data words acquired during said particular data acquisition from a circuit under test, and an output; and a register having an input for receiving a reload strobe, an input for receiving new digital reference words derived from said digital data words, and an output coupled to said digital reference word input of the digital word comparison unit for providing said digital reference word to said digital word comparison unit;

one of said new digital reference words being stored in said register as the digital reference word in response to said reload strobe.

8. The logic analyzer of claim 7 wherein:

said first and second word recognizers are programmed with a same particular external RAM address as the first and second reference values;

said reloadable word recognizer is programmed with a series of data patterns as said new digital reference words; and said logic analyzer performs an examination of an external RAM having a plurality of memory locations by writing each of said data patterns to each of said memory locations, and reading said data pattern back from each of said memory locations;

said reloadable word recognizer storing said data pattern when said same particular external RAM address is reached, and comparing said data pattern read from said same particular RAM address with said stored data pattern to generate an error signal if the result of said comparison is false.

9. The logic analyzer of claim 8 wherein, if the result of said comparison is true, a next data pattern of said series of data patterns is selected for writing to and reading from said memory locations.

10. A reloadable word recognizer arrangement for use in a test and measurement instrument, comprising:

a first digital word comparison unit having an input for receiving a first digital reference word representing a first reference value, an input for receiving digital data words acquired from a circuit under test, and an output;

a first register for storing said first digital reference word, and an output for providing to said first digital word comparison unit said first digital reference word;

a second digital word comparison unit having an input for receiving a second digital reference word representing a second reference value, an input for receiving digital data words acquired from a circuit under test, and an output;

a second register having an input coupled for storing as said second digital reference word said output of said first digital comparison unit, an input for receiving a reload strobe, and an output for providing to said second digital word comparison unit said second digital reference word;

said output from said first digital comparison unit being stored in said second register in response to said reload strobe.

11. The reloadable word recognizer of claim 10 wherein said test and measurement instrument comprises a logic analyzer.

* * * * *